(12) United States Patent
Sharon et al.

(10) Patent No.: US 9,070,479 B2
(45) Date of Patent: Jun. 30, 2015

(54) SYSTEMS AND METHODS OF UPDATING READ VOLTAGES

(71) Applicant: SANDISK TECHNOLOGIES INC., Plano, TX (US)

(72) Inventors: Eran Sharon, Rishon Lezion (IL); Idan Alrod, Herzliya (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 167 days.

(21) Appl. No.: 13/746,005

(22) Filed: Jan. 21, 2013

(65) Prior Publication Data

US 2014/0204671 A1 Jul. 24, 2014

(51) Int. Cl.

| G11C 11/34 | (2006.01) |
|---|---|
| G11C 29/04 | (2006.01) |
| G11C 11/56 | (2006.01) |
| G11C 16/04 | (2006.01) |
| G11C 16/26 | (2006.01) |
| G11C 16/34 | (2006.01) |

(52) U.S. Cl.
CPC ............ *G11C 29/04* (2013.01); *G11C 11/5642* (2013.01); *G11C 16/0483* (2013.01); *G11C 16/26* (2013.01); *G11C 16/3404* (2013.01)

(58) Field of Classification Search
USPC ............ 365/185.03, 185.09, 185.11, 185.18, 365/185.19, 185.22, 185.23, 185.24, 185.33
See application file for complete search history.

(56) References Cited

U.S. PATENT DOCUMENTS

| 5,657,332 | A | 8/1997 | Auclair et al. |
|---|---|---|---|
| 6,751,766 | B2 | 6/2004 | Guterman et al. |
| 7,012,835 | B2 | 3/2006 | Gonzalez et al. |
| 7,872,909 | B2 | 1/2011 | Song et al. |
| 7,954,037 | B2 | 5/2011 | Lasser et al. |
| 8,000,135 | B1 | 8/2011 | Perlmutter et al. |
| 8,072,805 | B2 | 12/2011 | Chou et al. |
| 8,125,827 | B2 | 2/2012 | Park |
| 8,351,258 | B1 * | 1/2013 | Yang et al. ............... 365/185.03 |
| 2008/0192544 | A1 | 8/2008 | Berman et al. |
| 2009/0175076 | A1 | 7/2009 | Cho et al. |
| 2009/0296480 | A1 | 12/2009 | Lee |
| 2011/0134692 | A1 | 6/2011 | Sharon et al. |
| 2011/0258496 | A1 * | 10/2011 | Tseng et al. .................. 714/704 |
| 2013/0159796 | A1 * | 6/2013 | Bedeschi ...................... 714/708 |

OTHER PUBLICATIONS

International Search Report and Written Opinion of the International Searching Authority (EPO) for International Application No. PCT/US2014/011524, mailed Mar. 27, 2014, 13 pages.

* cited by examiner

*Primary Examiner* — Fernando Hidalgo

(74) *Attorney, Agent, or Firm* — Toler Law Group, PC

(57) ABSTRACT

A method includes, in a data storage device that includes a non-volatile memory, reading data from the non-volatile memory using a first read voltage. The method includes determining a first count of errors in the data having a first error type and a second count of errors in the data having a second error type. A value of the first read voltage is selectively updated based on a comparison of the first count to the second count.

25 Claims, 3 Drawing Sheets

SYSTEMS AND METHODS OF UPDATING READ VOLTAGES

FIELD OF THE DISCLOSURE

The present disclosure is generally related to updating reference voltages in a data storage device.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that may be stored with the data as an ECC codeword. As more parity bits are used, an error correction capacity of the ECC increases and a number of bits required to store the encoded data also increases.

Once memory cells in a data storage device have been programmed, data may be read from the memory cells by sensing the programmed state of each memory cell and comparing the cell threshold voltage to one or more read voltages. However, the sensed programming states can sometimes vary from the written programmed states due to one or more factors, such as data retention and program disturb conditions. Data read from a memory cell may be erroneous when the threshold voltage of the memory cell has increased from a programmed voltage that is below a read threshold to a voltage above the read threshold or has decreased from a programmed voltage that is above a read threshold to a voltage below the read threshold.

SUMMARY

Accuracy of reading data stored in a data storage device may be improved by updating one or more read voltages based on counts of error types. Data may be read using the one or more read voltages and errors detected in the data may be categorized into types of errors, such as errors that are correctable by increasing a particular read voltage and errors that are correctable by decreasing the particular read voltage. One or more read voltages may be increased or decreased based on a comparison between the counts of the different error types, such as by determining when a count of one error type exceeds a count of another error type by more than a threshold amount. The updated read voltage(s) may be used in subsequent data read operations to reduce a total number of errors in data read from the data storage device, which will reduce the average ECC decoding latency and improve the probability that read data is decodable without using high resolution reading to enhance ECC correction capability. Reducing average ECC decoding latency and reducing average read resolution improves average read throughput, which may be governed by read times and decoding times.

Determining the counts of error types and updating read voltage(s) may be performed on-the-fly as a by-product of ECC decoding performed during read operations without requiring designated read operations for determining and calibrating the read thresholds, that would reduce the overall read throughput. Furthermore, determining counts of error types and updating read voltages on-the-fly enables continuous tuning of the read thresholds without requiring an ECC decoding failure to occur as a precondition for updating the read voltage(s), thus reducing or avoiding performance "hiccups" that result in reduced read throughput.

DETAILED DESCRIPTION

Figure 1:
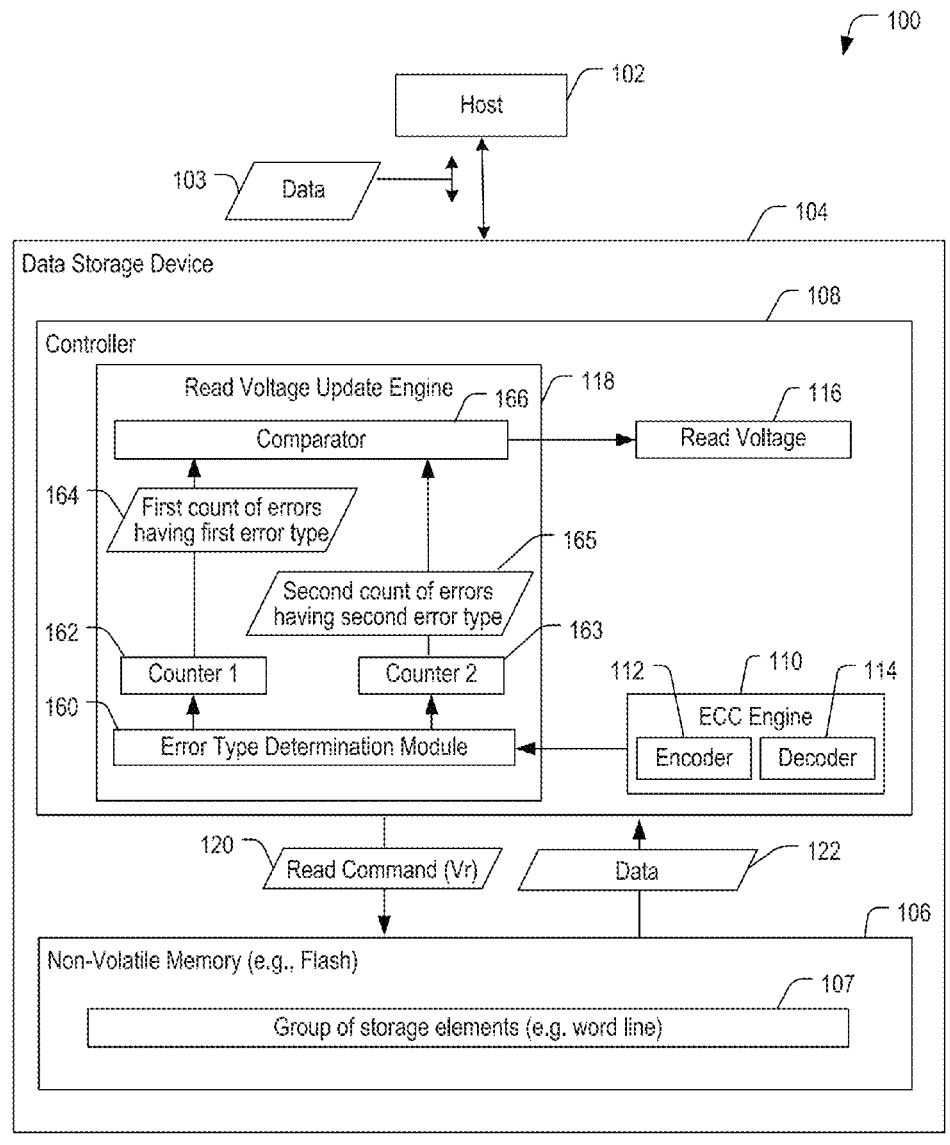
FIG. 1 is a block diagram of a particular illustrative embodiment of a system including a data storage device configured to update read voltages based on counts of errors having different error types.
Figure 1:
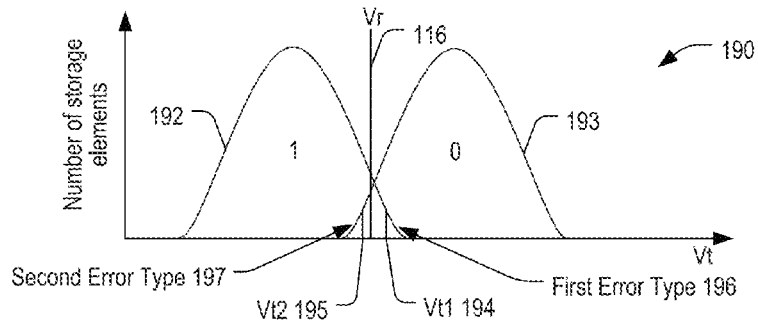

Referring to FIG. 1, a first particular embodiment of a system including a data storage device 104 that is configured to update read voltages based on comparisons of counts of multiple error types is depicted and generally designated 100. The system 100 includes a host device 102 operatively coupled to the data storage device 104. The data storage device 104 includes a read voltage update engine 118 that is configured to determine one or more error types in data read from a non-volatile memory 106 and to compare a first count 164 of errors having a first error type 196 to a second count 165 of errors having a second error type 197 (as depicted in a graph 190). Based on the comparison of the first count 164 to the second count 165, a read voltage 116 may be updated for reading data from the non-volatile memory 106.

The host device 102 may be configured to provide data, such as data 103, to be stored at the non-volatile memory 106 or to request data to be read from the non-volatile memory 106. For example, the host device 102 may include a mobile telephone, a music or video player, a gaming console, an electronic book reader, a personal digital assistant (PDA), a computer, such as a laptop computer, a notebook computer, or a tablet, any other electronic device, or any combination thereof.

The data storage device 104 includes the non-volatile memory 106 coupled to a controller 108. The non-volatile memory 106 may be a NAND flash memory. The non-volatile memory 106 includes a representative group 107 of storage elements, such as a word line of a multi-level cell (MLC) flash memory that includes multiple flash MLC cells. For example, the data storage device 104 may be a memory card, such as a Secure Digital SD® card, a microSD® card, a MiniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 104 may be configured to be coupled to the host device 102 as embedded memory, such as eMMC® (trademark of JEDEC Solid State Technology Association, Arlington, Va.) and eSD, as illustrative examples.

The controller 108 is configured to receive data and instructions from and to send data to the host device 102 while the data storage device 104 is operatively coupled to the host device 102. The controller 108 is further configured to send data and commands to the non-volatile memory 106 and to receive data from the non-volatile memory 106. For example, the controller 108 is configured to send data and a write command to instruct the non-volatile memory 106 to store the data to a specified address. As another example, the controller 108 is configured to send a read command to read data from a specified address of the non-volatile memory 106 using the read voltage 116.

The controller 108 includes an ECC engine 110 that is configured to receive data to be stored to the non-volatile memory 106 and to generate a codeword. For example, the ECC engine 110 may include an encoder 112 configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 110 may include a decoder 114 configured to decode data, such as data 122, that is read from the non-volatile memory 106 to detect and correct, up to an error correction capability of the ECC scheme, any bit errors that may be present in the data.

The read voltage update engine 118 includes an error type determination module 160, a first counter 162, a second counter 163, and a comparator 166. The error type determination module 160 is configured to receive decoding data from the ECC engine 110 and to categorize each error by error type, such as errors having the first error type 196 or errors having the second error type 197. The first error type 196 and the second error type 197 may be characterized according to a bit value that is read from the non-volatile memory 106 and according to whether the error is correctable by lowering a value of the read voltage 116 or by increasing the value of the read voltage 116, as described in further detail with respect to the graph 190.

The error type determination module 160 is configured to increment the first counter 162 in response to each detected error having the first error type 196 and to increment the second counter 163 in response to each detected error having the second error type 197. The first counter 162 generates the first count 164 of errors having the first error type 196 and the second counter 163 generates the second count 165 of errors having the second error type 197. The comparator 166 is configured to selectively update a value of the read voltage 116 based on a comparison of the first count 164 to the second count 165. For example, the comparator 166 may be configured to adjust the value of the read voltage 116 by a first amount in response to a difference between the first count 164 and the second count 165 exceeding a threshold, such as described in further detail with respect to FIG. 3.

During operation, the host device 102 may provide a request to the data storage device 104 to perform a data read operation to read the data 122 from the non-volatile memory 106. For example, the data 122 may be stored as an ECC codeword at the group of memory elements 107, such as a wordline of a flash memory. The data 122 may be received at the ECC engine 110 and a decode operation may be performed at the decoder 114.

Decoding data corresponding to the data 122 may be provided to the error type determination module 160. For example, the decoding data may include a bit value and a bit location of each erroneous bit that is detected and corrected in the data 122. The error type determination module 160 determines, for each error received in the decoding data from the ECC engine 110, whether the error has the first error type 196 or the second error type 197, and may provide an increment instruction to the corresponding one of the first counter 162 and the second counter 163.

The graph 190 illustrates a distribution of threshold values of storage elements (e.g., flash memory cells) in multiple states, including a first state 192 and a second state 193. An initial programming of the non-volatile memory 106 may generate non-overlapping distributions of storage elements in the first state 192 and in the second state 193 (i.e., error-free). However, during storage at the non-volatile memory 106, threshold voltages of individual storage elements may be changed so that one or more storage elements originally programmed to the first state 192 have a threshold voltage that exceeds the read voltage 116. Similarly, one or more storage elements originally programmed to have the second state 193 may have a threshold voltage shifted to a value less than the read voltage 116. As a result, over time, the distribution of storage elements originally programmed to the first state 192 may overlap with the distribution of storage elements originally programmed to the second state 193.

During a data read operation, a threshold value of each storage element may be compared to the read voltage 116 to determine a data value read from the particular storage element. Storage elements having threshold voltages that have shifted across the read voltage 116 may be erroneously read. For example, a storage element having a first threshold voltage Vt1 194 may have been originally programmed to have a 1 value (e.g., the first state 192), but upon reading the storage element using and comparing the threshold voltage Vt1 194 to the read voltage 116, the storage element may be read as having a 0 value. The error caused by the storage element originally programmed as having a 1 value but incorrectly read as having a 0 value is designated as the first error type 196. Errors having the first error type 196 may be correctible by increasing the read voltage 116. To illustrate, if the read voltage 116 is increased to a value greater than Vt1 194, a storage element having the threshold voltage Vt1 194 will be read as having a 1 value.

Similarly, a storage element originally programmed to have a 0 value (e.g., the second state 193) may have a threshold voltage Vt2 195 that has shifted during storage at the non-volatile memory 106 to a value less than the read voltage 116. A storage element having the threshold voltage Vt2 195 may be read as having bit value of 1. Errors due to storage elements originally programmed to have a bit value of 0 but incorrectly read as having a bit value of 1 are designated as having the second error type 197. Errors having the second error type 197 may be corrected by decreasing the read voltage 116. For example, when the read voltage 116 is decreased to a value less than Vt2 195, a storage element having a threshold voltage Vt2 195 will be read as having a 0 value.

After processing the decoding data corresponding to the data 122, the first count 164 may be provided by the first counter 162 to the comparator 166, and the second count 165 may be provided by the second counter 163 to the comparator 166. The comparator 166 may perform a comparison of the first count 164 and the second count 165, such as by determining whether a difference of the first count 164 and the second count 165 exceeds a threshold. In response to the comparison, the comparator 166 may cause a value of the read voltage 116 to be adjusted.

Because the errors having the first error type 196 may be correctible by increasing the read voltage 116, while errors having the second error type 197 may be correctible by lowering the read voltage 116, when the second count 165 exceeds the first count 164, the comparator 166 may adjust the read voltage 116 to have a lower value, reducing a number of errors having the second error type 197. When the first count of errors 164 exceeds the second count 165, the comparator 166 may cause the read voltage 116 to be increased, reducing a number of errors having the first error type 196. Updates to the read voltage 116 may be performed upon determining that one of the first count 164 or the second count 165 significantly exceeds the other of the first count 164 or the second count 165, such as by more than a threshold amount. The amount of increase or decrease of the read voltage 116 may be determined as a function of a relative difference between the counts of the two types of errors 196, 197 (e.g., a linear or piecewise-linear relationship between the relative difference and the amount of increase or decrease, as illustrative, non-limiting examples). The updated value of the read voltage 116 may be used in subsequent read operations, such as initiated by a read command 120, to reduce a number of errors during the subsequent read operations.

By updating the read voltage 116 based on a comparison between counts of errors having the first error type 196 and the second error type 197, a number of errors in data read from the non-volatile memory 106 may be reduced. As a result, a reliability of stored data may be improved due to fewer bit errors occurring during storage in the non-volatile memory 106. Improved reliability may enable operation using a less-powerful ECC engine, resulting in reduced power consumption, reduced device size, reduced manufacturing cost, or a combination thereof. Alternatively, or in addition, improved reliability may enable longer operational life of the non-volatile memory 106. Alternatively, or in addition, the reduced error rate may enable reducing the ECC decoding latency and decoding power or energy consumption, which is usually a function of the number of errors that the ECC needs to correct (particularly in iterative coding systems, where decoding time is highly dependent on the number of errors). Furthermore, the reduced error rate reduces the probability that certain time consuming mechanisms, such as using higher reading resolution for obtaining "soft" information in order to increase ECC correction capability or designated high resolution read operations aimed at determining optimal read thresholds, will be invoked. Hence, the reduced error rate improves the average read throughput, reduces probability for "hiccups" in the read throughput and reduces the read power or energy consumption.

Figure 2:
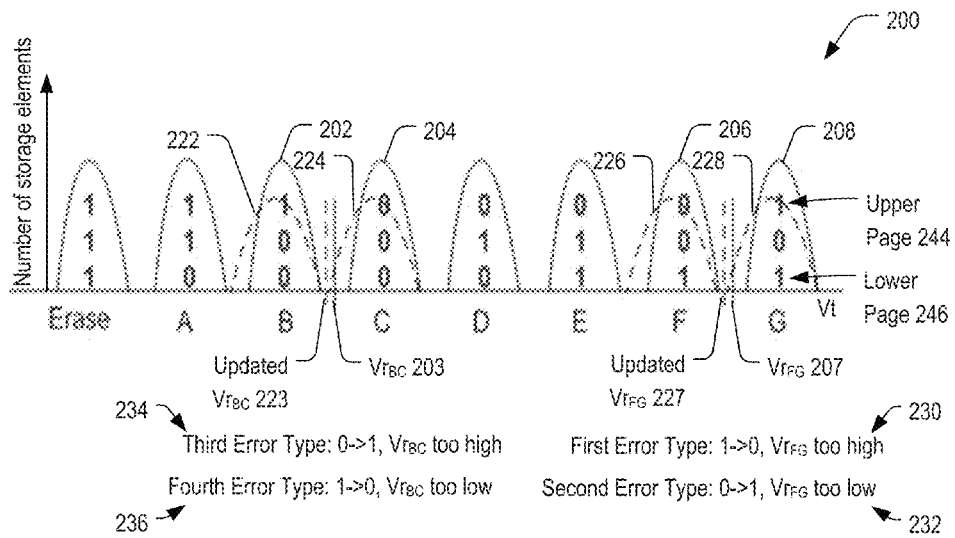
FIG. 2 is a graph of a particular embodiment of threshold distributions of storage elements illustrating multiple error types.

Although the graph 190 illustrates a distribution of the states 192, 193 for an operation of the non-volatile memory 106 in a single level cell (SLC) configuration, where each storage element (e.g., flash memory cell) is programmed to have one of two values and therefore stores a single bit of data, in other implementations the non-volatile memory 106 may store more than a single bit of data in each storage element, such as illustrated with respect to FIG. 2.

Referring to FIG. 2, a graph 200 illustrates a distribution of states of storage elements in the non-volatile memory 106 of FIG. 1 according to a multi-level cell (MLC) implementation. The graph 200 illustrates a three bits per cell (BPC) implementation where a threshold voltage of each storage element is programmed to one of eight distinct states Er, A, B, C, D, E, F, and G. Each distinct state represents a threshold voltage range and corresponds to a three bit value associated with the storage element. For example, an erase state (Er) corresponds to a bit value '111', state A corresponds to a bit value '110', and state G corresponds to a bit value of '101'. Each storage element may store a single bit for three logical pages. For example, a storage element in state A may store a '1' value corresponding to an upper page 244, a '1' value corresponding to a middle page, and a '0' value corresponding to a lower page 246.

Solid curves in the graph 200 represent probability distribution functions (PDFs) of storage elements in the states Er-G after an initial programming. Dashed curves illustrate representative PDFs of storage elements originally programmed to states B, C, F, and G after one or more conditions have altered threshold voltages of the storage elements, such as a number of program/erase (P/E) cycles, data retention (DR) effects, one or more conditions, or a combination thereof.

For example, an initial PDF 202 for state B may be shifted and broadened, resulting in an altered PDF 222, and an initial PDF 204 for state C may be shifted and broadened, resulting in an altered PDF 224. An initial read voltage $Vr_{BC}$ 203 may be used during a data read of the upper page 244 by applying $Vr_{BC}$ 203 to each storage element (e.g., as a gate voltage) and determining whether the storage element is activated (i.e., in state Er, A, or B, representing a '1' value in the upper page 244) or not activated (i.e., in state C, D, E, F, or G).

Similarly, initial PDFs 206 and 208 for states F and G, respectively, may be shifted and broadened, resulting in altered PDFs 226 and 228, respectively. An initial read voltage $Vr_{FG}$ 207 may be used during a data read of the upper page 244 by applying $Vr_{FG}$ 207 to each storage element (e.g., as a gate voltage) and determining whether the storage element is activated (i.e., in state Er, A, B, C, D, E, or F) or not activated (i.e., in state G, representing a '1' value in the upper page 244). Cells not activated when $Vr_{BC}$ 203 is applied but activated when $Vr_{FG}$ 207 is applied represent a '0' value in the upper page 244.

However, after altering of the PDFs 202, 204, 206, and 208, reading the upper page 244 from the storage elements using the initial read voltages $Vr_{BC}$ 203 and $Vr_{FG}$ 207 may result in errors according to four error types: a first error type 230, a second error type 232, a third error type 234, and a fourth error type 236. For example, the first error type 230 corresponds to a storage element programmed to have a '1' value that is read as having a '0' value and that is correctable by lowering the read voltage. For example, a storage element programmed to state G but read as state F (i.e., the threshold voltage has shifted below $Vr_{FG}$ 207) results in an error in the upper page 244 having the first error type 230. A storage element programmed to have a '0' value that is read as having a '1' value and that is correctable by increasing the read voltage has the second error type 232. For example, a storage element programmed to state F but read as state G (i.e., the threshold voltage has shifted above $Vr_{FG}$ 207) results in an error in the upper page 244 having the second error type 232.

The third error type 234 corresponds to a storage element programmed to have a '0' value that is read as having a '1' value and that is correctable by decreasing the read voltage. For example, a storage element programmed to state C but read as state B (i.e., the threshold voltage has shifted below $Vr_{BC}$ 203) results in an error in the upper page 244 having the third error type 234. The fourth error type 236 corresponds to a storage element programmed to have a '1' value that is read as having a '0' value and that is correctable by increasing the read voltage. For example, a storage element programmed to state B but read as state C (i.e., the threshold voltage has shifted above $Vr_{BC}$ 203) results in an error in the upper page 244 having the fourth error type 236.

After reading and decoding the upper page 244, if a count of errors having the first error type 230 exceeds a count of errors having the second error type 232, the initial read voltage $Vr_{FG}$ 207 may be lowered to an updated $Vr_{FG}$ 227, reducing an occurrence of errors having the first error type 230. Alternatively, if a count of errors having the second error type 232 exceeds a count of errors having the first error type 230, the initial read voltage $Vr_{FG}$ 207 may be increased. Similarly, if a count of errors having the third error type 234 exceeds a count of errors having the fourth error type 236, the initial read voltage $Vr_{BC}$ 203 may be lowered to an updated $Vr_{BC}$ 223, reducing an occurrence of errors having the third error type 234. Alternatively, if a count of errors having the fourth error type 236 exceeds a count of errors having the third error type 234, the initial read voltage $Vr_{BC}$ 203 may be increased.

However, reading the upper page 244 alone may not provide sufficient information to distinguish between errors having the first error type 230 and the fourth error type 236 when a '1' value in the upper page 244 is incorrectly read as a '0' value. To illustrate, reading the upper page 244 and performing ECC decoding may identify a storage element as being programmed to store a '1' but read as a '0', but may not provide information indicating whether the storage element was programmed to state C (and that the error can be corrected by lowering $Vr_{BC}$ 203) or whether the storage element was programmed to state F (and that the error can be corrected by increasing $Vr_{FG}$ 207). Similarly, reading the upper page 244 alone may not provide sufficient information to distinguish between errors having the second error type 232 and the third error type 234 when a '0' value in the upper page 244 is incorrectly read as a '1' value.

Information provided by reading the lower page 246 can help distinguish between errors in the upper page 244 having the first error type 230 and the fourth error type 236 and between errors in the upper page 244 having the second error type 232 and the third error type 234. To illustrate, when a storage element is programmed to state B or state C, the lower page 246 for the storage element corresponds to a '0' value, and when the storage element is programmed to state F or state G, the lower page 246 for the storage element corresponds to a '1' value. Similarly, information from the upper page 244 can help distinguish between errors in the lower page 246, as storage elements programmed to states Er and A (a first transition point in the lower page 246) correspond to a '1' value in the upper page 244, and storage elements programmed to states D and E (a second transition point in the lower page 246) correspond to a '0' value in the upper page 244. The middle page is illustrated as having three transitions (between states A and B, C and D, and E and F) and errors occurring in the middle page may be distinguished between the four error types 230-236 using information from the upper page 244 and from the lower page 246.

During a page-by-page read, e.g., reading only the upper page 244 using the read voltages 203 and 207, the controller 108 of FIG. 1 may cause an additional page (e.g., the lower page 246) to be read to distinguish between the error types 230-236. However, during a sequential read operation, all three logical pages may be read concurrently (e.g., using each read voltage between adjacent states to distinguish all eight states). Sequential read operations therefore provide sufficient information to enable distinguishing between the four error types 230-236, as described with respect to FIG. 3.

Figure 3:
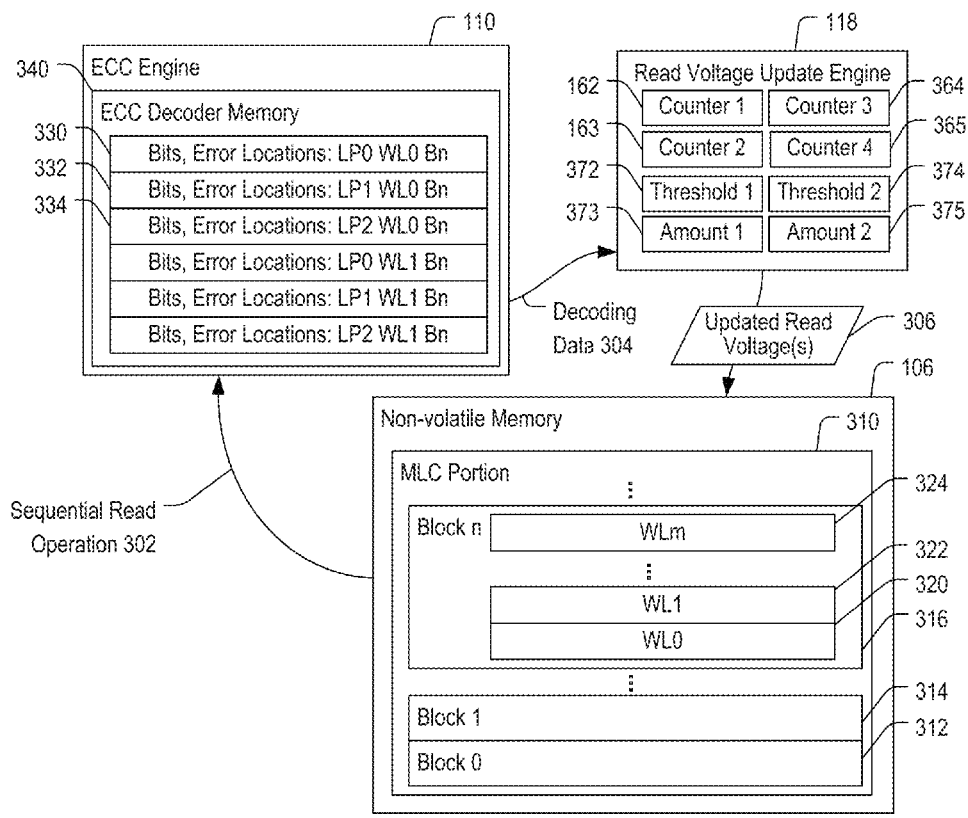
FIG. 3 is a block diagram of a particular illustrative embodiment of components that may be incorporated in the data storage device of FIG. 1.

Referring to FIG. 3, a particular embodiment of components of the data storage device 104 of FIG. 1 is illustrated. The non-volatile memory 106 is illustrated as including multiple blocks, such as Block 0 312, Block 1 314, and an nth block (Block n) 316. Each block 312-316 may include multiple wordlines, such as wordline 0 (WL0) 320, wordline 1 322, and wordline m 324.

The ECC engine 110 is illustrated as including an ECC decoder memory 340 that includes multiple portions, such as a first portion 330, a second portion 332, and a third portion 334. Each portion 330-334 may be populated with error correction data, such as bit values and locations of errors of each logical page that is read from the non-volatile memory 106.

The read voltage update engine 118 is illustrated as including the first counter 162 and the second counter 163. The read voltage update engine 118 further includes a third counter 364 configured to generate a third count of errors having the third error type 234 of FIG. 2 and a fourth counter 365 configured to generate a fourth count of errors having the fourth error type 236 of FIG. 2. The read voltage update engine 118 also includes a first threshold 372, a second threshold 374, a first amount 373 corresponding to the first threshold 372, and a second amount 375 corresponding to the second threshold 374.

During operation, a sequential read operation 302 may be performed at the non-volatile memory 106 to sequentially read multiple logical pages from sequential wordlines within a particular block of the MLC portion 310 of the non-volatile memory 106, such as Block n 316. Data read from the sequential logical pages of the sequential wordlines may be provided to the ECC decoder memory 340, and decoding data corresponding to each logical page may be stored in a corresponding portion of the ECC decoder memory 340. For example, the first portion 330 includes decoding data corresponding to first logical page LP0 (e.g., the lower page 246 of FIG. 2) at WL0 320 of Block n 316. The second portion 332 corresponds to a next sequential logical page read from the non-volatile memory 106 and includes decoding data corresponding to a next logical page LP1 (e.g., the middle page of FIG. 2) of WL0 320. The third portion 334 includes decoding data corresponding to a third logical page read from the non-volatile memory 106, designated as LP2 (e.g., the upper page 244 of FIG. 2) of WL0 320. Similarly, the sequential read operation 302 may include reading data from LP0, LP1, and LP2 of a next sequential wordline (e.g., WL1 322).

After completion of error correction operations at a portion of the ECC decoder memory 340, the portion may be freed to receive and process another logical page read during the sequential read operation 302. Prior to freeing a particular portion, decoding data 304 for the particular portion may be provided to the read voltage update engine 118. The decoding data 304 may be received at the error type determination module 160 of FIG. 1 that determines whether each error detected in the corresponding logical page has the first error type 230, the second error type 232, the third error type 234, or the fourth error type 236 as described with respect to FIG. 2. A value of a corresponding counter 162, 163, 364, or 365 is incremented according to the determination of each error type, and a corresponding count of errors may be provided to the comparator 166 of FIG. 1 for a comparison operation. Because the read voltage update engine 118 operates on the decoding data 304 after decoding is completed and prior to freeing the corresponding portion of the ECC decoder memory 340, determining the updated read voltage(s) 306 may be performed without impacting a performance of the sequential read operation 302.

The updated read voltage(s) 306 may be determined after reading one or more wordlines of Block n 316 during the sequential read operation 302 and used to read other sequential logical pages from wordlines of Block n 316 during the sequential read operation 302. For example, the updated read voltage(s) 306 may be determined after sequentially reading a first group of one or more wordlines from a data block during a sequential read operation. The updated read voltage(s) 306 may be used to read other wordlines in the same block n 316, and optionally the updated read voltage(s) 306 may be used to read other wordlines in the other blocks. Alternatively, updating the read voltage(s) may be performed in a continuous manner, such that read thresholds are fine-tuned from one wordline reading operation to the next wordline reading operation as a byproduct of the ECC decoding results, as long as the error counts indicate that further fine-tuning may be beneficial (i.e., error counts are not balanced to within a particular threshold). As a result, the average read throughput and power or energy consumption of the block may be reduced or minimized, as error rates are lowered, resulting in reduced ECC decoding latency (or reduced ECC and read "hiccups") and reduced ECC power or energy consumption.

The read voltage update engine 118 may compare counts of errors of the first error type 230 (from the first counter 162) to counts of errors of the second error type 232 (from the second counter 163) and compare a difference between the counts to the first threshold 372 and/or the second threshold 374. To illustrate, the second threshold 374 may be larger than the first threshold 372 and the second amount 375 may be larger than the first amount 373. If the difference between the counts exceeds the second threshold 374, the read voltage update engine 118 may adjust the corresponding read voltage (e.g., $Vr_{FG}$ 207 of FIG. 2) by the second amount 375. For example, $Vr_{FG}$ 207 may be decreased by the second amount 375 when the count of errors of the first error type 230 exceeds the count of errors of the second error type 232 by more than the second threshold 374 or may be increased by the second amount 375 when the count of errors of the second error type 232 exceeds the count of errors of the first error type 230 by more than the second threshold 374. If the difference between the counts does not exceed the second threshold 374 but exceeds the first threshold 372, the read voltage update engine 118 may adjust the corresponding read voltage (e.g., $Vr_{FG}$ 207 of FIG. 2) by the first amount 373. If the difference between the counts does not exceed the first threshold 372, the read voltage update engine 118 may not adjust the corresponding read voltage.

Other implementations may increase or decrease one or more read voltages according to other amounts. For example, in the implementation illustrated in FIG. 3 the amount of increase or decrease of a read voltage is a function of a relative difference between counts of error types (i.e., a zero amount, the first amount 373, or the second amount 375 based on the difference between counts of error types). As other examples, a single threshold and adjustment amount may be used, or more than two thresholds and adjustment amounts may be used. Alternatively, the amount of increase or decrease may be a continuous function of the difference between counts of error types, such as a linear function, a quadratic function, and/or an exponential function, as illustrative examples.

In some implementations, each read voltage (e.g., each of the seven read voltages used to distinguish the eight states of FIG. 2) is adjusted independently of the other read voltages by determining counts of error types associated with the particular read voltage (e.g., $Vr_{FG}$ 207 of FIG. 2 is updated independently of $Vr_{BC}$ 203) so that some read voltages may increase while other read voltages decrease or remain unchanged. In other implementations, comparisons of the error types are performed for a selected subset of the read voltages and the tuning of the other read voltages (not in the subset) is a function of the tuning of the selected set of reading voltages. For example, the error types for the boundaries between states B-C and states F-G of FIG. 2 may be determined, and the read voltages for these boundaries may be tuned accordingly. The tuning of the read voltages for the other boundaries may be set to be identical to the tuning of the read voltages at the B-C, F-G boundaries. Alternatively, the tuning of the read voltages for the other boundaries may be set to be some other function of the tuning of the read voltages at the B-C, F-G boundaries.

As another particular example, an implementation of the read voltage update engine 118 of FIG. 3 may categorize errors into the first error type 196 and the second error type 197 of FIG. 1 instead of the four error types 230-236, using the first counter 162 and the second counter 163 but omitting the third counter 364 and the fourth counter 365. The first counter 162 may be incremented for each error that is correctable by increasing a read voltage (e.g., errors having the second error type 232 and errors having the fourth error type 236). The second counter 163 may be incremented for each error that is correctable by decreasing a read voltage (e.g., errors having the first error type 230 and errors having the third error type 234). All read voltages may be tuned by a same amount on a page-by-page basis. For example, updating for the upper page 244 of FIG. 2 may include updating $Vr_{BC}$ 203 and $Vr_{FG}$ 207 of FIG. 2 in a same direction and by a same amount based on values at the first counter 162 and the second counter 163. Read voltages for each logical page may be updated independently of the read voltages of the other logical pages. Alternatively, the correction applied to one page may be applied to multiple pages or all pages. For example, some physical phenomena that may cause a threshold voltage of some boundaries to drift to a higher value may also cause a same or similar threshold voltage drift to other boundaries.

Figure 4:
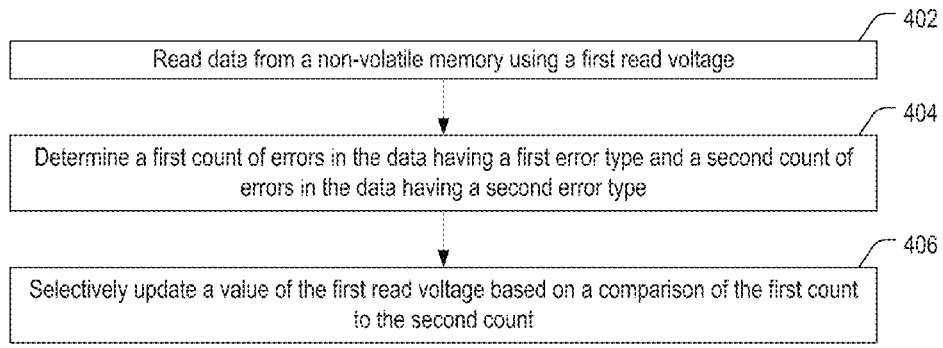
FIG. 4 is a flow chart of a particular illustrative embodiment of a method of updating read voltages based on counts of errors having different error types.

FIG. 4 illustrates particular embodiment of a method 400 that may be performed in a data storage device that includes a non-volatile memory, such as the data storage device 104 of FIG. 1. The method 400 includes reading data from the non-volatile memory using a first read voltage, at 402. For example, the data 122 of FIG. 1 may be read from the non-volatile memory 106 in response to a request from the host device 102.

A first count of errors in the data having a first error type and a second count of errors in the data having a second error type are determined, at 404. For example, the first count 164 and the second count 165 of FIG. 1 may be determined by the error type determination module 160 incrementing the first counter 162 and the second counter 163 in response to each detected error type in the data 122. The first error type may correspond to a bit of the data having a first bit value that differs from a second bit value programmed to the non-volatile memory, and errors having the first error type may be correctable by lowering the value of the first read voltage (e.g., the first error type 196 of FIG. 1). The second error type may correspond to another bit of the data having the second bit value that differs from the first bit value programmed to the non-volatile memory, and errors having the second error type may be correctable by increasing the value of the first read voltage (e.g., the second error type 197 of FIG. 1).

A value of the first read voltage is selectively updated based on a comparison of the first count to the second count, at 406. Selectively updating the value of the first read voltage may include selectively increasing or decreasing the value of the first read voltage by a first amount in response to a difference between the first count and the second count exceeding a first threshold. For example, the read voltage 116 may be updated in response to a comparison result of the first count 164 and the second count 165 at the comparator 166 indicating that one of the first count 164 or the second count 165 exceeds the other of the first count 164 and the second count 165 by more than a threshold amount. Selectively updating the value of the first read voltage may include selectively increasing or decreasing the value of the first read voltage by a second amount in response to the difference exceeding a second threshold, such as described with respect to the second amount 375 and the second threshold 374 of FIG. 3.

The data may be decoded at an error correction code (ECC) decoder without generating an ECC decoding failure prior to selectively updating the value of the first read voltage. For example, the data 122 of FIG. 1 may be decoded at the ECC decoder 114 without generating an ECC decoding failure due to a number of errors in the data 122 exceeding a correction capability of the ECC decoder 114.

The method 400 may therefore enable updating of a read voltage at a data storage device that includes a non-volatile memory based on counts of error types. In the embodiment illustrated in FIG. 1, the non-volatile memory 106 may include a single-level cell (SLC) portion configured to store a single bit in each storage element of the SLC portion, and the data 122 is read from the SLC portion. In the embodiments illustrated in FIGS. 2-3, the non-volatile memory 106 includes a multi-level cell (MLC) portion configured to store multiple bits in each storage element of the MLC portion, and the data is read from the MLC portion. In an MLC implementation, a method of updating read voltages may include determining and comparing additional error types, as described in further detail with respect to FIG. 5.

Figure 5:
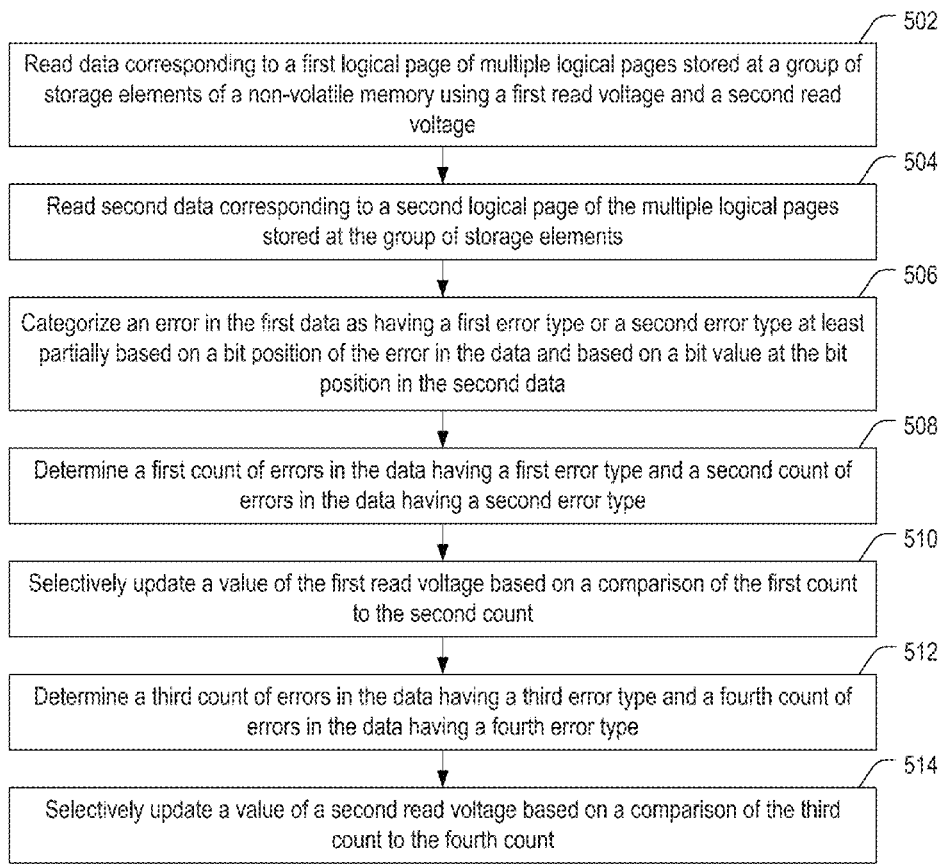
FIG. 5 is a flow chart of another illustrative embodiment of a method of updating read voltages based on counts of errors having different error types.

FIG. 5 illustrates particular embodiment of a method 500 that may be performed in a data storage device that includes a non-volatile memory, such as the data storage device 104 of FIG. 1 that includes a MLC portion of the non-volatile memory 106, such as described with respect to FIGS. 2-3. The method 500 may include reading data corresponding to a first logical page of multiple logical pages stored at a group of storage elements of the non-volatile memory using a first read voltage and a second read voltage, at 502. For example, the upper page 244 of FIG. 2 may be read from WL0 320 of the non-volatile memory 106 of FIG. 3 using $Vr_{BC}$ 203 and $Vr_{FG}$ 207 of FIG. 2.

Second data may be read corresponding to a second logical page of the multiple logical pages stored at the group of storage elements, at 504. For example, the second data may correspond to the lower page 246 of FIG. 2.

An error in the data may be categorized as having the first error type or the second error type at least partially based on the error. For example, an error at a bit position in the upper page 244 of FIG. 2 may be categorized as having the first error type 230 when a '1' value is incorrectly read as a '0' value and the corresponding bit position in the lower page 246 has a '1' value.

A first count of errors in the data having a first error type and a second count of errors in the data having a second error type are determined, at 508. For example, the first count may correspond to the first error type 230 of FIG. 2 and the second count may correspond to the second error type 232.

A value of the first read voltage is selectively updated based on a comparison of the first count to the second count, at 510. Selectively updating the value of the first read voltage may include selectively increasing or decreasing the value of the first read voltage by a first amount in response to a difference between the first count and the second count exceeding a first threshold. For example, $Vr_{FG}$ 207 of FIG. 2 may be updated in response to a comparison result of the first count of errors having the first error type 230 and the second count of errors having the second error type 232, such as described with respect to the read voltage update engine 118 of FIG. 3.

A third count of errors in the data having a third error type and a fourth count of errors in the data having a fourth error type may be determined, at 512. For example, the third count may correspond to the third error type 234 of FIG. 2 and the fourth count may correspond to the fourth error type 236.

A value of a second read voltage may be selectively updated based on a comparison of the third count to the fourth count, at 514. For example, $Vr_{BC}$ 203 of FIG. 2 may be updated in response to a comparison result of the third count of errors having the third error type 234 and the fourth count of errors having the fourth error type 236, such as described with respect to the read voltage update engine 118 of FIG. 3.

In some implementations, the value of the first read voltage is updated independently of updating the value of the second read voltage. For example, $Vr_{BC}$ 203 and $Vr_{FG}$ 207 of FIG. 2 may be updated independently of each other. In some implementations, at least one read voltage corresponding to the second logical page is updated based on the update of the first read voltage. For example, the read voltage between states Er-A and/or D-E corresponding to the lower page 246 of FIG. 2 may be updated based on updates of $Vr_{BC}$ 203 and/or $Vr_{FG}$ 207 corresponding to the upper page 244.

The data may be read from a first portion of a particular block of the non-volatile memory during a sequential read operation, such as the sequential read operation 302 of FIG. 3. After updating the value of the first read voltage, the updated value of the first read voltage may be used during reading of a second portion of the particular block during the sequential read operation, such as the updated read voltage(s) 306 determined after reading one or more wordlines of a block during the sequential read operation 302 and used to read other wordlines of the block during the sequential read operation 302. For example, a determination of the first count of errors and the second count of errors may include accessing, during the sequential read operation 302, a portion of an error correction code (ECC) decoder memory (e.g., the first portion 330) that stores bit information of the data and error location information of the data prior to freeing the portion of the ECC decoder memory.

Although the FIG. 5 illustrates the method 500 as updating four counts of errors corresponding to four error types, in other embodiments two error types may be tracked for an MLC memory rather than four error types. For example, a first count of errors that are correctable by increasing a corresponding read voltage (independent of whether the errors correspond to a 1 value or to a 0 value) may be compared to a second count of errors that are correctable by decreasing a corresponding read voltage (independent of whether the errors correspond to a 1 value or to a 0 value). For example, in the upper page 244 of FIG. 2, the first count may updated whenever a '0' value is read as a '1' and the lower page is a '1' (e.g., when a cell originally programmed to state F is incorrectly read as state G) or whenever a '1' value is read as a '0' and the lower page is a '0' (e.g., when a cell originally programmed to state B is incorrectly read as state C). The second count may updated whenever a '1' value is read as a '0' and the lower page is a '1' (e.g., when a cell originally programmed to state G is incorrectly read as state F) or whenever a '0' value is read as a '1' and the lower page is a '0' (e.g., when a cell originally programmed to state C is incorrectly read as state B). Multiple read voltages of a page may be adjusted based on a result of the comparison (e.g., based on comparing a difference in the counts to one or more thresholds, such as the thresholds 372, 374 of FIG. 3). For example, all read voltages of the page may be adjusted in a same direction and by a same amount as determined based on a result of the comparison.

Although various components depicted herein are illustrated as block components and described in general terms, such components may include one or more microprocessors, state machines, or other circuits configured to enable the read voltage update engine 118 of FIG. 1 or FIG. 3 to update one or more read voltages. For example, the read voltage update engine 118 may represent physical components, such as hardware controllers, state machines, logic circuits, or other structures, to enable the read voltage update engine 118 to determine whether one or more read voltages are to be adjusted based on comparing counts of multiple error types.

The read voltage update engine 118 may be implemented using a microprocessor or microcontroller programmed to receive decoding data from an ECC decoder, determine an error type of each error that is corrected by the ECC decoder, generate counts of different detected error types, and update one or more read voltages based on comparisons of the counts of the detected error types. In a particular embodiment, the read voltage update engine 118 includes a processor executing instructions that are stored at the non-volatile memory 106. Alternatively, or in addition, executable instructions that are executed by the processor may be stored at a separate memory location that is not part of the non-volatile memory 106, such as at a read-only memory (ROM).

In a particular embodiment, the data storage device 104 may be implemented in a portable device configured to be selectively coupled to one or more external devices. However, in other embodiments, the data storage device 104 may be attached or embedded within one or more host devices, such as within a housing of a host communication device. For example, the data storage device 104 may be within a packaged apparatus such as a wireless telephone, a personal digital assistant (PDA), a gaming device or console, a portable navigation device, or other device that uses internal non-volatile memory. In a particular embodiment, the data storage device 104 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a non-volatile memory, the non-volatile memory including a multi-level cell (MLC) portion configured to store multiple bits per storage element, performing:
      reading data from the MLC portion using a first read voltage; wherein the data is read as a first logical page of multiple logical pages stored at a group of storage elements;
      reading second data corresponding to a second logical page of the multiple logical pages stored at the group of storage elements;
      categorizing at least one error in the data as having a first error type or a second error type at least partially based on a bit position of the at least one error in the data and based on a bit value at the bit position in the second data;
      determining a first count of errors in the data that are categorized as having the first error type and a second count of errors in the data that are categorized as having the second error type; and
      selectively updating a value of the first read voltage based on a comparison of the first count to the second count.

2. The method of claim 1, wherein the first error type corresponds to a bit of the data having a first bit value that differs from a second bit value programmed to the non-volatile memory, wherein errors having the first error type are correctable by lowering the value of the first read voltage, wherein the second error type corresponds to another bit of the data having the second bit value that differs from the first bit value programmed to the non-volatile memory, and wherein errors having the second error type are correctable by increasing the value of the first read voltage.

3. The method of claim 1, wherein selectively updating the value of the first read voltage includes selectively increasing or decreasing the value of the first read voltage by a first amount in response to a difference between the first count and the second count exceeding a first threshold.

4. The method of claim 3, wherein selectively updating the value of the first read voltage includes selectively increasing or decreasing the value of the first read voltage by a second amount in response to the difference exceeding a second threshold.

5. The method of claim 1, wherein the non-volatile memory includes a single-level cell (SLC) portion configured to store a single bit in each storage element of the SLC portion.

6. The method of claim 1, further comprising:
   determining a third count of errors in the data having a third error type and a fourth count of errors in the data having a fourth error type; and
   selectively updating a value of a second read voltage based on a comparison of the third count to the fourth count.

7. The method of claim 6, wherein the value of the first read voltage is updated independently of updating the value of the second read voltage.

8. The method of claim 6, wherein at least one read voltage corresponding to the second logical page is updated based on the update of the first read voltage.

9. A method comprising:
   in a data storage device that includes a non-volatile memory, performing:
      reading data from the non-volatile memory using a first read voltage;
      determining a first count of errors in the data having a first error type and a second count of errors in the data having a second error type; and selectively updating a value of the first read voltage based on a comparison of the first count to the second count, wherein the data is read from a first portion of a particular region of the non-volatile memory during a sequential read operation and wherein after updating the value of the first read voltage, the updated value of the first read voltage is used during reading of the second portion of the particular region during the sequential read operation, and wherein determining the first count of errors and the second count of errors includes accessing, during the sequential read operation, a portion of an error correction code (ECC) decoder memory that stores bit information of the data and error location information of the data.

10. The method of claim 1, wherein the data is decoded at an error correction code (ECC) decoder without generating an ECC decoding failure prior to selectively updating the value of the first read voltage.

11. A data storage device comprising:
a non-volatile memory including a multi-level cell (MLC) portion configured to store multiple bits in each storage element of the MLC portion; and
a controller configured to:
receive data read from the MLC portion of the non-volatile memory using a first read voltage, wherein the data is received as a first logical page of multiple logical pages stored at a group of storage elements;
receive second data corresponding to a second logical page of the multiple logical pages stored at the group of storage elements;
categorize at least one error in the data as having a first error type or a second error type at least partially based on a bit position of the at least one error in the data and based on a bit value at the bit position in the second data; and
selectively update a value of the first read voltage based on a comparison of a first count of errors in the data that are categorized as having the first error type to a second count of errors in the data that are categorized as having the second error type.

12. The data storage device of claim 11, wherein the first error type corresponds to a bit of the data having a first bit value that differs from a second bit value programmed to the non-volatile memory, wherein errors having the first error type are correctable by lowering the value of the first read voltage, wherein the second error type corresponds to another bit of the data having the second bit value that differs from the first bit value programmed to the non-volatile memory, and wherein errors having the second error type are correctable by increasing the value of the first read voltage.

13. The data storage device of claim 11, wherein the controller is configured to adjust the value of the first read voltage by a first amount in response to a difference between the first count and the second count exceeding a first threshold.

14. The data storage device of claim 13, wherein the controller is further configured to adjust the value of the first read voltage by a second amount in response to the difference exceeding a second threshold.

15. The data storage device of claim 11, wherein the non-volatile memory includes a single-level cell (SLC) portion configured to store a single bit in each storage element of the SLC portion.

16. The data storage device of claim 11, wherein the controller is further configured to determine a third count of errors in the data having a third error type and a fourth count of errors in the data having a fourth error type and to selectively update a value of a second read voltage based on a comparison of the third count to the fourth count.

17. The data storage device of claim 16, wherein the controller is configured to update the value of the first read voltage independently of updating the value of the second read voltage.

18. The data storage device of claim 16, wherein at least one read voltage corresponding to the second logical page is updated based on the update of the first read voltage.

19. The data storage device of claim 11, wherein the data is read from a first portion of a particular block of the non-volatile memory during a sequential read operation and wherein after updating the value of the first read voltage, the updated value of the first read voltage is used during reading of a second portion of the particular block during the sequential read operation.

20. The data storage device of claim 19, wherein the controller includes an error correction code (ECC) decoder having an ECC decoder memory, wherein during the sequential read operation a portion of the ECC decoder memory that stores bit information of the data and error location information of the data is accessed to determine the first count of errors and the second count of errors prior to freeing the portion of the ECC decoder memory.

21. The method of claim 9, wherein the first error type corresponds to a bit of the data having a first bit value that differs from a second bit value programmed to the non-volatile memory, wherein errors having the first error type are correctable by lowering the value of the first read voltage, wherein the second error type corresponds to another bit of the data having the second bit value that differs from the first bit value programmed to the non-volatile memory, and wherein errors having the second error type are correctable by increasing the value of the first read voltage.

22. The method of claim 9, wherein selectively updating the value of the first read voltage includes selectively increasing or decreasing the value of the first read voltage by a first amount in response to a difference between the first count and the second count exceeding a first threshold.

23. The method of claim 22, wherein selectively updating the value of the first read voltage includes selectively increasing or decreasing the value of the first read voltage by a second amount in response to a difference exceeding a second threshold.

24. The method of claim 9, further comprising determining a third count of errors in the data having a third error type and a fourth count of errors in the data having a fourth error type and selectively updating a value of a second read voltage based on a comparison of the third count to the fourth count.

25. The method of claim 24, wherein the value of the first read voltage is updated independently of updating the value of the second read voltage.

* * * * *